(12) United States Patent
Dobyns et al.

(10) Patent No.: US 8,102,396 B2
(45) Date of Patent: Jan. 24, 2012

(54) APPARATUS AND METHOD FOR IMPROVED MEASUREMENT SPEED IN TEST AND MEASUREMENT INSTRUMENTS

(75) Inventors: Kenneth P. Dobyns, Beaverton, OR (US); Paul M. Gerlach, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 204 days.

(21) Appl. No.: 11/488,310

(22) Filed: Jul. 17, 2006

(65) Prior Publication Data

US 2008/0012861 A1    Jan. 17, 2008

(51) Int. Cl.
    *G09G 5/22* (2006.01)
(52) U.S. Cl. .................. 345/440.1; 345/440; 345/441
(58) Field of Classification Search .......... 345/440–443; 382/168–172; 702/57–80
    See application file for complete search history.

(56) References Cited

U.S. PATENT DOCUMENTS

| | | | | |
|---|---|---|---|---|
| 5,003,248 A * | 3/1991 | Johnson | ................ | 324/121 R |
| 5,613,197 A * | 3/1997 | Copeland et al. | ................ | 455/22 |
| 5,877,621 A * | 3/1999 | Beyers et al. | ................ | 324/121 R |
| 5,986,637 A * | 11/1999 | Etheridge et al. | ................ | 345/596 |
| 5,995,117 A * | 11/1999 | Dobyns et al. | ................ | 345/441 |
| 6,104,374 A * | 8/2000 | Sullivan et al. | ................ | 345/694 |
| 6,201,527 B1 * | 3/2001 | Dobyns | ................ | 345/440.1 |
| 6,249,115 B1 * | 6/2001 | Yost et al. | ................ | 324/121 R |
| 6,278,435 B1 * | 8/2001 | Etheridge et al. | ................ | 345/440.1 |
| 6,473,701 B1 * | 10/2002 | Tallman et al. | ................ | 702/67 |
| 6,502,045 B1 * | 12/2002 | Biagiotti | ................ | 702/66 |
| 6,532,024 B1 * | 3/2003 | Everett et al. | ................ | 715/716 |
| 6,559,868 B2 * | 5/2003 | Alexander et al. | ................ | 715/781 |
| 6,832,174 B2 * | 12/2004 | Tran et al. | ................ | 702/121 |
| 6,847,905 B2 * | 1/2005 | Etheridge et al. | ................ | 702/67 |
| 6,989,833 B2 * | 1/2006 | Narita | ................ | 345/440.1 |
| 7,184,906 B2 * | 2/2007 | Fender et al. | ................ | 702/67 |
| 2001/0022588 A1 * | 9/2001 | Yost et al. | ................ | 345/619 |
| 2002/0080149 A1 * | 6/2002 | Alexander et al. | ................ | 345/634 |
| 2002/0128786 A1 * | 9/2002 | Alexander | ................ | 702/66 |
| 2002/0180737 A1 * | 12/2002 | Letts | ................ | 345/440.1 |
| 2003/0152266 A1 * | 8/2003 | Ivers et al. | ................ | 382/169 |
| 2003/0179242 A1 * | 9/2003 | Alexander et al. | ................ | 345/781 |
| 2003/0218612 A1 * | 11/2003 | Dobyns | ................ | 345/440 |
| 2003/0231187 A1 * | 12/2003 | Dobyns et al. | ................ | 345/619 |
| 2005/0261853 A1 * | 11/2005 | Dobyns | ................ | 702/108 |
| 2007/0236480 A1 * | 10/2007 | Sullivan et al. | ................ | 345/204 |

* cited by examiner

*Primary Examiner* — Xiao M. Wu
*Assistant Examiner* — Charles Tseng
(74) *Attorney, Agent, or Firm* — Derek Meeker; Francis I. Gray; Thomas F. Lenihan (57) ABSTRACT

An apparatus for measuring a parameter of a digitized signal including a digitizer to digitize an input signal into a digitized signal, a rasterizer to generate a raster image from the digitized input signal, a processor to receive the raster image, and a control interface to receive an input control signal indicating a request for a measurement. The rasterizer is responsive to the control signal to generate the raster image from the digitized input signal, and the processor is responsive to the control signal to generate a histogram from the raster image.

10 Claims, 6 Drawing Sheets

APPARATUS AND METHOD FOR IMPROVED MEASUREMENT SPEED IN TEST AND MEASUREMENT INSTRUMENTS

BACKGROUND OF THE INVENTION

This invention relates to test and measurement instruments and, more particularly, to test and measurement instruments capable of measuring parameters of digitized waveforms.

Modern digital oscilloscopes generally provide a measurement feature whereby specific waveform parameters, such as peak-to-peak voltage, rise time, pulse width, etc. are calculated for the acquired waveform data and presented to the user. A central processing unit (CPU) within the oscilloscope generally computes these measurements.

The process begins by moving a digitized waveform from acquisition memory to CPU memory where it can be processed. The first step in a measurement calculation is the generation of a vertical histogram of the digitized levels found within the waveform. This histogram is used to find key values within the waveform (high, mid, mean, etc.) These values are, in turn, used to derive the vertical measurements. Additionally, these values are used to allow the extraction of the crossing information necessary for the calculation of timing measurements.

Unfortunately, this approach to the generation of measurements requires moving the entire waveform record to the CPU memory space. Furthermore, the CPU is typically designed for general-purpose computing, not for the specific purpose of manipulating waveform data to generate a histogram. As a result, the overall waveform throughput rate, a key feature of a modern digital oscilloscope, is reduced. In order to keep the waveform throughput high, most oscilloscopes update their measurements infrequently. Consequently, the digital oscilloscope is unable to efficiently perform further functions using the measurements, such as a statistical analysis of the measurements.

Accordingly, there remains a need for a test and measurement instrument having an improved measurement speed.

SUMMARY

An aspect of the invention includes an apparatus for measuring a parameter of a digitized signal including a digitizer to digitize an input signal into a digitized input signal, a rasterizer to generate a raster image from the digitized input signal, a processor to receive the raster image, and a control interface to receive an input control signal indicating a request for a measurement. The rasterizer is responsive to the control signal to generate the raster image from the digitized input signal, and the processor is responsive to the control signal to generate a histogram from the raster image.

Another aspect of the invention includes a method of measuring a parameter of a digitized signal in a test and measurement instrument. The method includes digitizing an input signal, receiving a control signal requesting a measurement, rasterizing the input signal into a raster image in response to the control signal, converting rows of the raster image into entries of a histogram, and calculating the parameter using the histogram.

The foregoing and other aspects of the invention, and advantages thereof, will become more readily apparent from the following detailed description and accompanying drawings.

DETAILED DESCRIPTION

As described above, measurements made on digitized waveforms are made infrequently so that the waveform throughput rate is not adversely affected. To achieve an increased measurement speed, a rasterizer can be used to calculate the vertical histogram.

As used in this discussion, a rasterizer is any device or apparatus that processes digitized waveform data and generates a raster image formed of pixels. Thus, the rasterizer converts data into a format suitable for digital displays using pixels to present images.

Modern digital oscilloscopes generally contain a high-speed rasterizer for drawing acquired waveforms. In order to achieve high waveform throughput, data movement must be kept to a minimum. Thus, these rasterizers are located near the acquisition hardware where they have access to waveform data as it is acquired.

In order to draw waveforms that emulate a traditional analog CRT, rasterizers usually contain hardware that implements a grayscale attack and decay function on a digital or pixelated display. A side effect of this feature is that these rasterizers maintain a multi-bit intensity for each display pixel that they create. Thus, a value corresponding to the intensity is stored for each pixel.

There are a variety of ways to adjust the intensity of a pixel. In one in particular, a "dots only" mode, individually acquired points are added to the raster image. While most rasterizers attempt to draw vectors (connecting lines) between individual acquisition points, this feature can be disabled to draw one pixel per acquisition point without filling in any intervening points.

By placing a rasterizer in a "dots only" mode, it can be used to generate a histogram by "rasterizing" the waveform into a single column, for example. As the waveform is rasterized, each data point increments, by one, the intensity of the pixel that corresponds to that digitizing level. The bit-depth of the rasterizer controls how many waveform points can be accumulated into the histogram without risk of data saturation. At the completion of the rasterization process, the single-column raster image contains a complete histogram of the input data.

Although rasterization generally includes the conversion of some form of data into a two-dimensional pixelated representation of that data, rasterization, as used in this discussion specifically includes the degenerate case of conversion of the data into a one-dimensional row or column of pixels.

Furthermore throughout this discussion, horizontal rows and vertical columns are used to describe the relationships of pixels, particularly within a raster image. However, one skilled in the art will understand that particular designations of rows and columns are used for convenience of description and may be used interchangeably.

A rasterizer is generally faster than the CPU at manipulating the waveform data. The rasterizer may be specifically designed for this purpose. In addition, the waveform data itself does not need to be moved to the CPU to calculate measurements. In one example, only the histogram itself, which is significantly reduced in size, need be moved to and processed by the CPU. Thus, the rasterizer can generate the histogram data, improving the speed with which measurements can be made.

Figure 1:
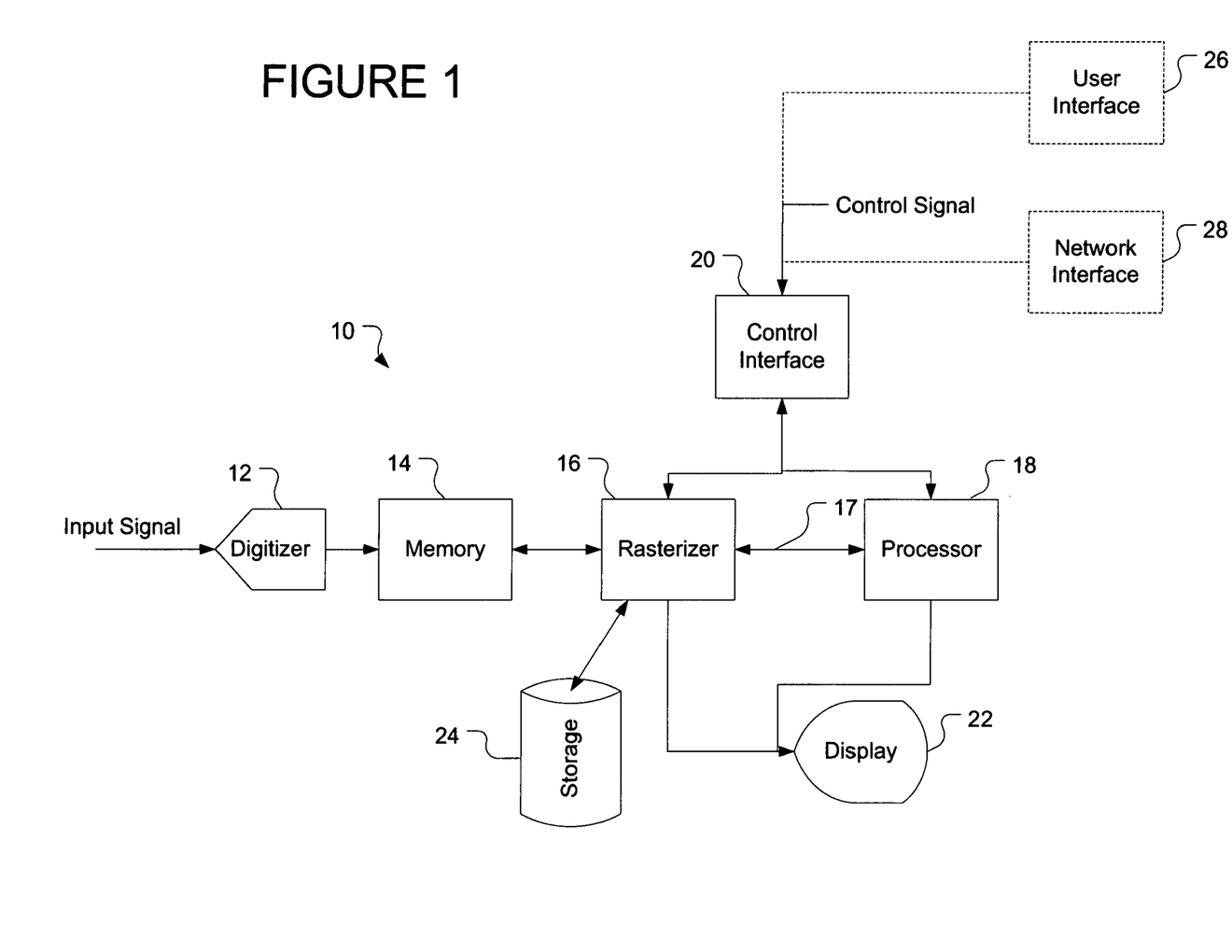
FIG. 1 is a block diagram of an apparatus for measuring a parameter of a digitized signal according to an embodiment of the invention.

FIG. 1 is a block diagram of an apparatus for measuring a parameter of a digitized signal according to an embodiment of the invention. The apparatus 10 includes a digitizer 12, a memory 14, a rasterizer 16, a processor 18, and a control interface 20. The digitizer 12 digitizes an input signal into a digitized signal. The digitized signal is stored in the memory 14.

The digitizer 12 may be any variety of digitizer using any style of signal acquisition capable of transforming a signal into a digital representation of that signal. For example, the digitizer 12 may include a successive approximation analog-to-digital converter (ADC) operating in a real-time sampling mode, sampling as often as possible. Alternatively, the digitizer 12 may include a direct conversion ADC operating in an equivalent-time sampling mode, sampling at a determined time period after a trigger. Any combination of digitizer and operating mode may be used such that a digitized representation of the signal is stored in the memory 14.

The processor 18 may communicate directly or indirectly with the rasterizer 16. For example, a data bus 17 may link the processor 18 and the rasterizer 16. In addition, the processor 18 may communicate with the rasterizer 16 through a common memory. The common memory may be the memory 14 or another memory separate from the memory 14.

Furthermore, although the memory 14 has been illustrated in FIG. 1 as located between the digitizer 12 and the rasterizer 16, such a memory is not required. For example, the digitizer 12 may send digitized data to the rasterizer 16 rather than through the memory.

As used herein, a processor 18 may include microprocessors, microcontrollers, digital signal processors (DSP), field programmable gate arrays (FPGA), programmable logic devices (PLD), or the like. Any such device that can manipulate digital data may be used as a processor 18.

During general operation, the digitized signal is rasterized in the rasterizer 16 into a raster image to be displayed as a two dimensional (m×n) array of pixels on the display 22. However, if an input control signal requesting a measurement is received by the control interface 20, the rasterizer 16 generates a raster image in response to this control signal. The raster image may be a 1×n raster image with only one column. The processor 18 then generates a histogram from this raster image.

Figure 2:
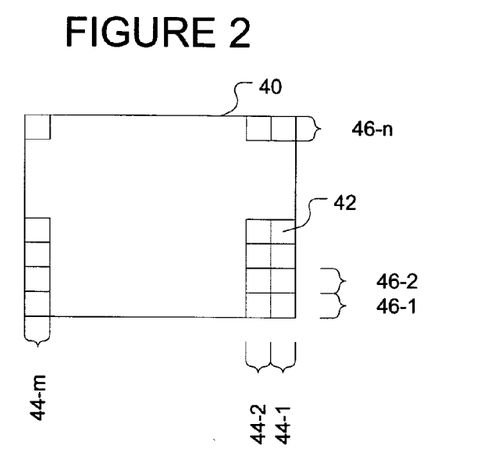
FIG. 2 is a block diagram of a raster image.

FIG. 2 is a block diagram of a raster image. A raster image 40 is formed of multiple pixels 42. The pixels 42 may be arranged in an m×n array of rows 46 and columns 44. For example, 44-2 represents the second column 44. A raster image 40 may have any number of rows 46 and columns 44.

Figure 3:
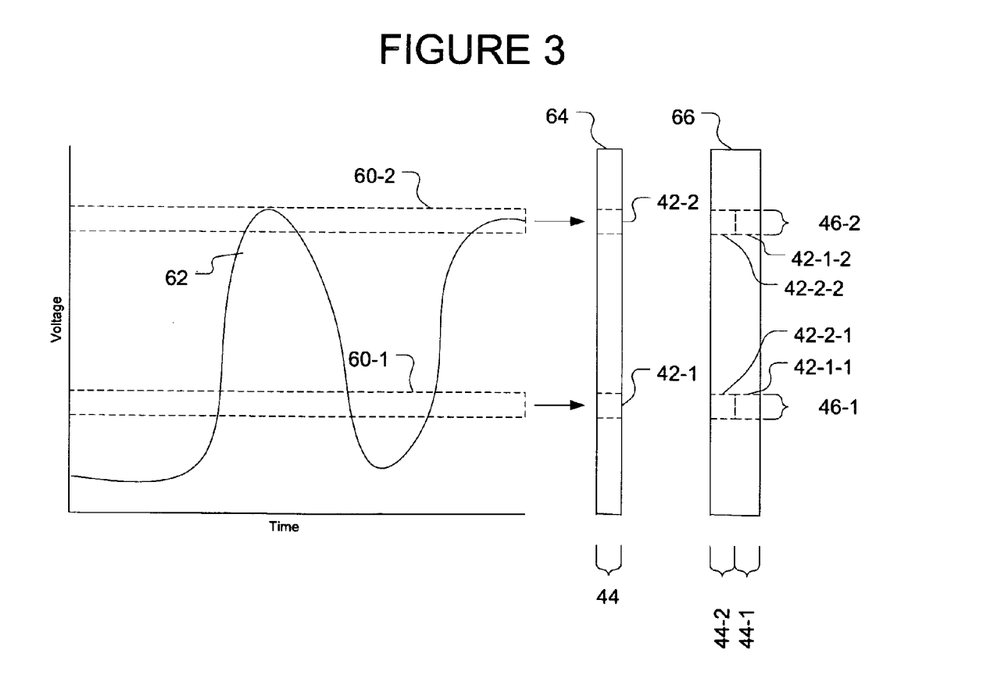
FIG. 3 is a diagram illustrating the relationship in the apparatus of FIG. 1 of digitizing levels of a digitized signal and pixels of a raster image as shown in FIG. 2.

FIG. 3 is a diagram illustrating the relationship in the apparatus of FIG. 1 of digitizing levels of a digitized signal and pixels of a raster image as shown in FIG. 2. FIG. 3 includes a graph of an input signal 62 having a voltage varying over time. Digitizing levels 60 describe voltage ranges over which the input signal 62 are digitized into the same digitizing level 60. For example, two digitizing levels 60-1 and 60-2 are illustrated corresponding to two voltage ranges.

In general operation, the rasterizer 16 may create a raster image 40 to be displayed on a display 22. Each pixel 42 may be associated with a memory location or register storing a multi-bit representation of that pixel 42. The columns 44 may represent different times associated with the waveform. The rows 46 may represent different amplitudes. For example, a first sample of the waveform at a first time may be rasterized into a pixel 42 at a first column 44-1 and a first row 46-2. A second sample of the waveform at a second time having the same amplitude as the first sample may be rasterized into a different second column 44-2 and the same row 46-2. The rasterizer 16 modifies the values corresponding to the pixels 42 to create a raster image representing the input signal 62. Multiple columns 44 may be used to represent the time span displayed on the display 22.

In response to the control signal, the rasterizer 16 may rasterize the input signal 62 into a single-column raster image 64. Every sample of the digitized input signal at a particular digitizing level 60 is rasterized into a corresponding pixel 42 of the single-column raster image 64. For example, samples within digitizing level 60-2 are rasterized into pixel 42-2. In contrast to the general operation of the rasterizer 16 described above, even though the input signal 62 may be varying over time, all samples are rasterized into a single column 44 of the single-column raster image 64.

The apparatus 10 may include storage 24 or other memory including instructions or code enabling the rasterizer to rasterize in response to the control signal. The code in the storage may cause the rasterizer 16 to change its function to rasterize the input signal into a single-column raster image 64.

During the rasterization into the single-column raster image 64, the rasterizer 16 may increment a pixel in the single-column raster image 64 corresponding to each sample of the digitized input signal. In one example, the value stored in a pixel 42-1 is incremented by one when rasterizing a sample with a corresponding digitizing level 60-1. Similarly, the value stored in a pixel 42-2 is incremented by one when rasterizing a sample with a corresponding digitizing level 60-2. Thus, all samples of one particular digitizing level 60 increment the value stored at the pixel 42 associated with that digitizing level 60.

Although incrementing the value in a pixel 42 by one has been described, any technique for incrementing may be used. For example, initial samples associated with a pixel 42 may increment the value by one. However, as the value stored in the pixel 42 increases, a greater number of samples may be required in order to increment the value by one. For example, if a value stored in a pixel 42 is one half of its maximum value, two samples may be needed in order to increase the value by one. Thus, the value of a pixel 42 need not have a one-to-one relationship with the number of samples rasterized into that pixel. Any encoding may be used as desired.

As a result of rasterizing the input signal 62 into a single-column raster image 64, the time information associated with the samples of the input signal 62 may be discarded. Thus, the remaining data is the distribution of the input signal 62 over the digitizing levels 60. In other words, the data within the single-column raster image 64 is a histogram of the input signal 62.

Although a single-column raster image 64 has been described, a multi-column raster image 66 may be used. In particular, if the depth of one pixel 42 of a single-column raster image 64 is not sufficient to hold a desired count of samples for the histogram, multiple pixels may be used to extend the maximum number of samples. For example, if one pixel 42 has a bit depth of 8, and can store a count of up to 255, an additional pixel 42 having a bit depth of 8 may be used, giving the combination an ability to store a count of up to 65535. Although one particular coding scheme for representing a count of samples in multiple pixels has been described, other coding schemes may be used. For example, a value in a first pixel is incremented until the count reaches a maximum count for the first pixel. Then a value in a subsequent pixel is incremented. Each time a value in a pixel reaches a maximum count, further samples are added to subsequent pixels. Thus, with two pixels having bit depths of 8 bits, counts for 255 samples may be stored in each pixel, giving the sum of two pixels an ability to store a count of up to 510.

In the example illustrated in FIG. 3, the samples corresponding to one digitizing level 60 are all rasterized to be contained within the pixels 42 of one row 46 of the multi-column raster image 66. For example, samples within the digitizing level 60-1 are rasterized into the pixels 42-1-1 and 42-2-1 of row 46-1. In contrast to a raster image to be displayed on a display 22, the multi-column raster image 66 may not have any time information. The raster image for display purposes may use the columns 44 to indicate a different time. However, in the multi-column raster image 66, the additional pixel 42-2-1 of the row 46-1 is used for extended storage of the sample count.

Although two pixels 42 have been illustrated in the multi-column raster image 66, any number of pixels 42 of a row may be used. Furthermore, although additional pixels 42 specifically referencing a multi-column raster image 66 have been illustrated in adjacent columns 44-1 and 44-2, the additional pixels 42 may be located anywhere in the raster image. For example, two pixels 42 within one column 44 may correspond to one digitizing level 60, and two columns 44 are used to provide enough pixels 42 of all of the digitizing levels 60.

Regardless of the number of columns 44 used, the raster image is then sent by the rasterizer 16 to the processor 18. If the raster image is a multi-column raster image 66, the processor 18 can collapse the rows 46 into entries of the histogram. Although, the processor 18 is described as generating the histogram, the generation may only involve copying the data from the raster image. In particular, if the raster image is a single-column raster image 64, no additional processing is needed to generate the histogram beyond converting the data of the single-column raster image 64 into a format suitable for the processor 18 to calculate measurements.

As a result of the rasterizing into a single or multi-column raster image 64 or 66, the data used to calculate a histogram that is sent to the processor 18 is no longer the entire waveform data. In one example, the raster image alone, occupying less storage space than the source waveform, is sent to the processor 18. Thus, the time needed to transfer the larger waveform data is no longer needed. Furthermore, the rasterizer 16, specifically designed for translating digitized data into a raster image, may translate digitized data faster than the accompanying processor 18. As a result, the time required by the processor 18 to generate a histogram is significantly reduced.

Although an example including transferring the raster image alone has been described above, some or all of the source waveform data may be transferred to the processor 18 for some measurements. For example, time-based measurements, such as periods and pulse widths, may need the waveform data in order to generate threshold-crossing information for such measurements. However, even though the entire source waveform data may be transferred to the processor 18, the time required to generate such measurements is still reduced as a result of the processing efficiency of the rasterizer 16 described above.

Once the histogram is generated by the processor 18, the processor 18 may generate any number of measurements from the histogram, including providing the histogram itself as the desired measurement. As a result of most if not all of the calculation for a histogram being offloaded to the rasterizer 16, the processor 18 has more time for other tasks. Specifically, since data for generating the histograms may come at a faster rate and the processor has available time, more histograms may be generated and more corresponding measurements may be calculated. Thus, the overall rate at which measurements can be updated is increased.

Although the processor 18 has been described as generating a histogram using a single raster image, similar to the way that multiple pixels of one row may be used to extend the maximum count, multiple raster images may be combined together into one histogram. For example, the rasterizer 16 may rasterize a first half of the digitized waveform into a first raster image, and rasterize a second half of the digitized waveform into a second raster image. Both raster images may be transferred to the processor 18 for calculating the histogram.

Referring again to FIG. 1, in order to allow a user to request a measurement, the apparatus 10 may include a user interface 26. The user interface 26 generates the control signal in response to a user input. The user interface 26 may include any type of interface, including touch screens, buttons, dials, sliders, keyboards, or the like.

In addition, the apparatus 10 may include a network interface 28 to receive the control signal. Control signals may be generated at remote locations. These control signals may be communicated to the apparatus 10 through the network interface 28. Thus, measurements may be made in response to control signals generated external to the apparatus 10.

In another embodiment, an apparatus for measuring a parameter of a digitized signal includes means for digitizing an input signal, means for receiving a control signal requesting a measurement, means for rasterizing the input signal into a raster image in response to the control signal, means for converting rows of the raster image into entries of a histogram, and means for calculating the parameter using the histogram.

The means for digitizing an input signal may include the digitizer 16 described above and any associated control and storage to convert the input signal into digitized data. The means for digitizing the input signal may further include means for digitizing the input signal into multiple digitizing levels.

The means for receiving a control signal requesting a measurement may include circuitry such as the control interface 20 described above. For example, the means for receiving a control signal may be capable of monitoring a user interface 26 for a control signal. In addition, the means for receiving the control signal may include a processor monitoring the user interface 26 described above for a control signal, the network interface 28 described above, or combinations of such interfaces.

The means for rasterizing the input signal into a raster image in response to the control signal may include a rasterizer 16 described above. Any such rasterizer capable of rasterizing an input signal into a raster image, such that one or more pixels of the raster image can represent a count of samples at a particular digitizing level, may be used. Thus, the means for rasterizing the input signal may include means for rasterizing each digitizing level into a corresponding row of the raster image. In particular, each digitizing level may be rasterized into a corresponding pixel.

The means for converting rows of the raster image into entries of a histogram and the means for calculating the parameter using the histogram may include one or more processors 18 as described above. For example, a FPGA may manipulate the data of a raster image, collapsing a multi-column raster image 66 into a histogram, and a microcontroller may receive the histogram and calculate measurements from the histogram. Any combination of processors, or a single processor may be used.

Figure 4:
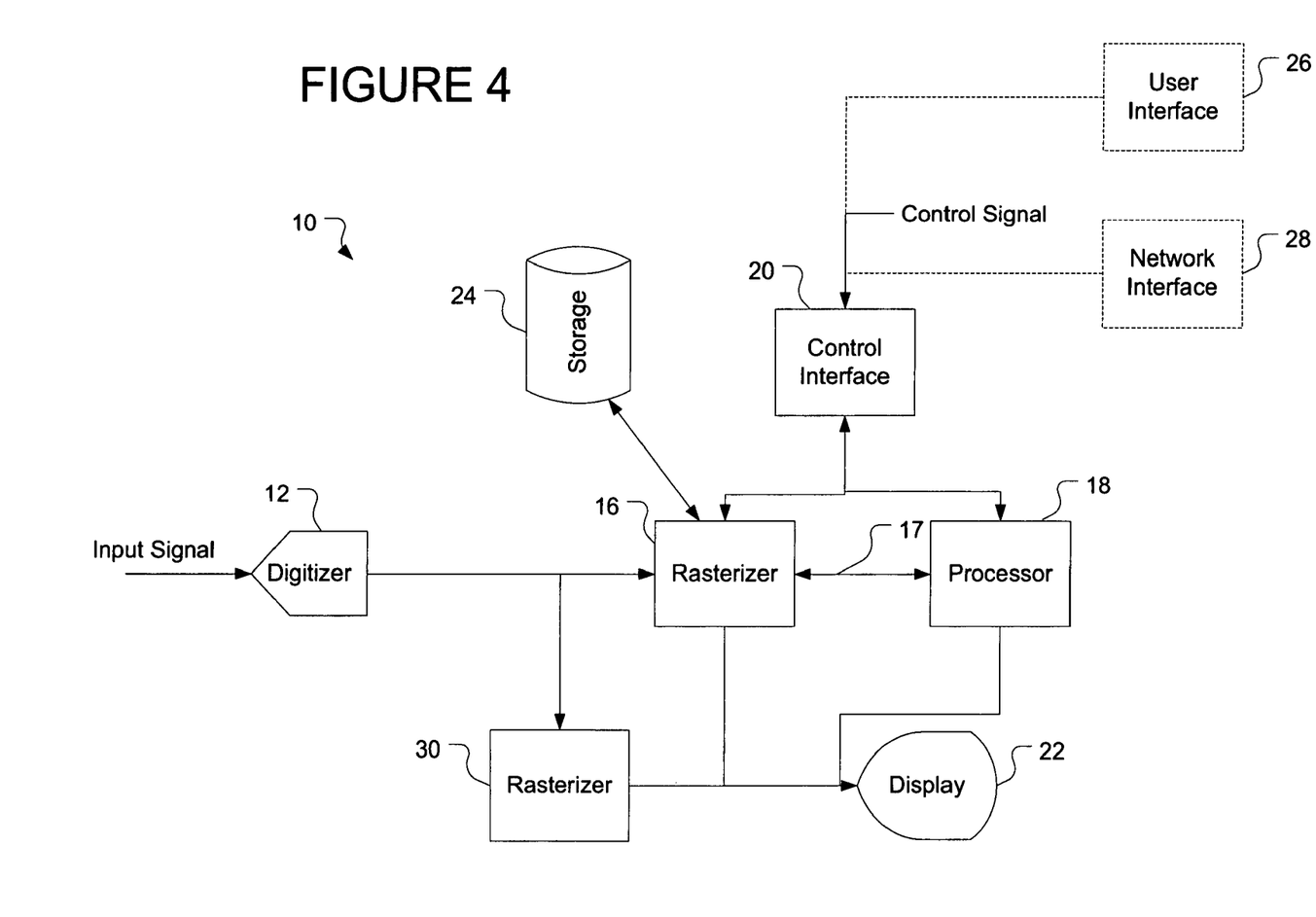
FIG. 4 is a block diagram of an apparatus for measuring a parameter of a digitized signal according to another embodiment of the invention.

FIG. 4 is a block diagram of an apparatus for measuring a parameter of a digitized signal according to another embodiment of the invention. In FIG. 4, a second rasterizer 30 is coupled to the digitizer 12. The second rasterizer 30 may generate a second raster image of the digitized input signal. The second raster image may be a raster image suitable for displaying the waveform on a display 22.

Although the rasterizing of the input signal 62 into a single-column raster image 64 or a multi-column raster image 66 has been described above in contrast to the general operation of the rasterizer 16, such operations are not mutually exclusive and may be performed at substantially the same time. For example, the input signal 62 may be rasterized into a single-column raster image 64 by rasterizer 16 in parallel with rasterizing the input signal 62 into another m×n raster image for presenting on a display in the second rasterizer 30. As a result, data of the input signal 62 that is used to generate a histogram is not lost, and may be displayed with the histogram and any derived measurements.

Furthermore, any memory or storage used to store a raster image may be independent of a memory or storage used to store a raster image for general display purposes. For example, each raster image may be stored in a different portion of the memory 14 described above. Thus, the creation of each raster image may be performed independently.

In addition, even though the raster images have been described as being generated from the same data, the raster images may be generated from different sets of data. For example, a first amount of data suitable for generating a first m×n raster image for display purposes may be smaller than a second amount of data used to generate a second single or multi-column raster image for generating a histogram with a desired accuracy. Thus, a new raster image for display may be generated each time the first amount of data is received, while the second amount of data is being accumulated for the second raster image.

Figure 5:
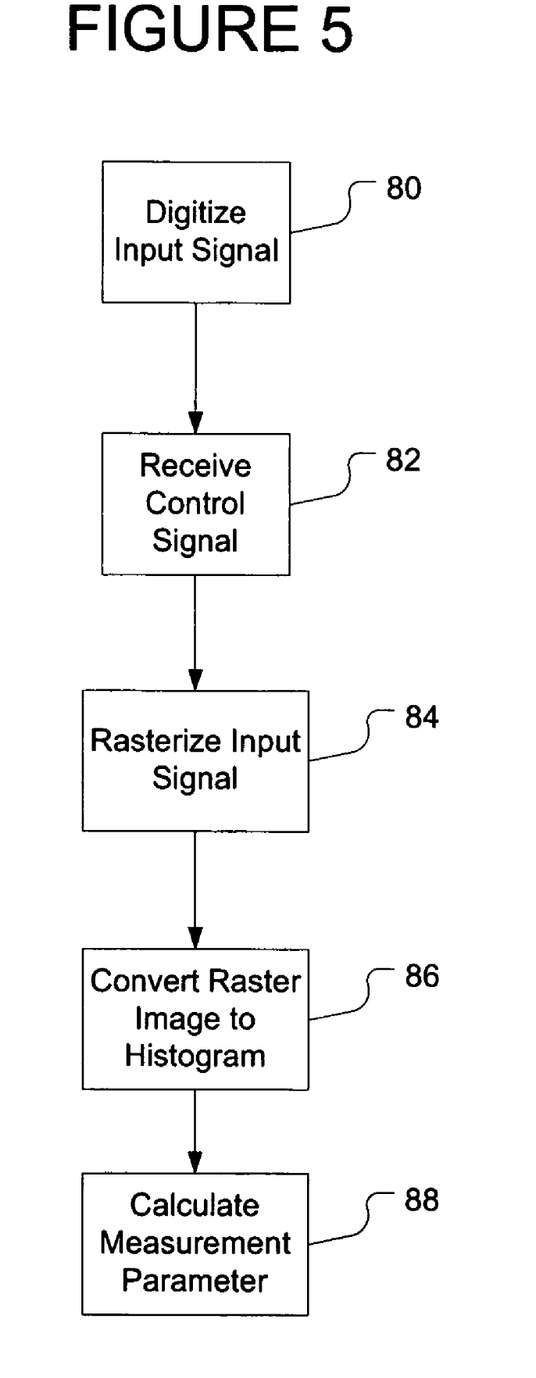
FIG. 5 is a flowchart of a method of measuring a parameter of a digitized signal according to an embodiment of the invention.

FIG. 5 is a flowchart of a method of measuring a parameter of a digitized signal according to an embodiment of the invention. The method includes digitizing an input signal in 80, receiving a control signal requesting a measurement in 82, rasterizing the input signal into a raster image in response to the control signal in 84, converting rows of the raster image into entries of a histogram in 86, and calculating the parameter using the histogram 88. Thus, receiving a control signal requesting a measurement results in a parameter of a digitized signal being calculated using a raster image of the input signal.

Digitizing an input signal in 80 includes converting the input signal into a digital representation. Thus, the digitized input signal is converted into multiple digitizing levels. When rasterized into a raster image in 84, each row of the raster image may correspond to one digitizing level. Thus, there may be as many rows in the raster image as there are digitizing levels. In addition, as described above, each row may include only one pixel so that each digitizing level corresponds to one pixel.

Alternatively, the digitizing in 80 and rasterizing in 84 may be performed such that the number of digitizing levels is not equal to the number of rows of the raster image. As a result, one digitizing level may span more than one pixel, and may increase the values of those pixels appropriately. In such a case, each pixel or row of the raster image may be changed by an amount less than the amount that would be used if there was a one-to-one relationship of pixels to digitizing levels.

Furthermore, even though the number of pixels in a column and the number of digitizing levels may not be equal, a one-to-one relationship may still be maintained. For example, if the number of digitizing levels is less than the maximum number of pixels in a column of a raster image, a subset of the pixels of may be used to create a one-to-one relationship. Thus, each digitizing level may be mapped to an associated pixel even though the number of digitizing levels is different from the number of pixels in a column.

Figure 6:
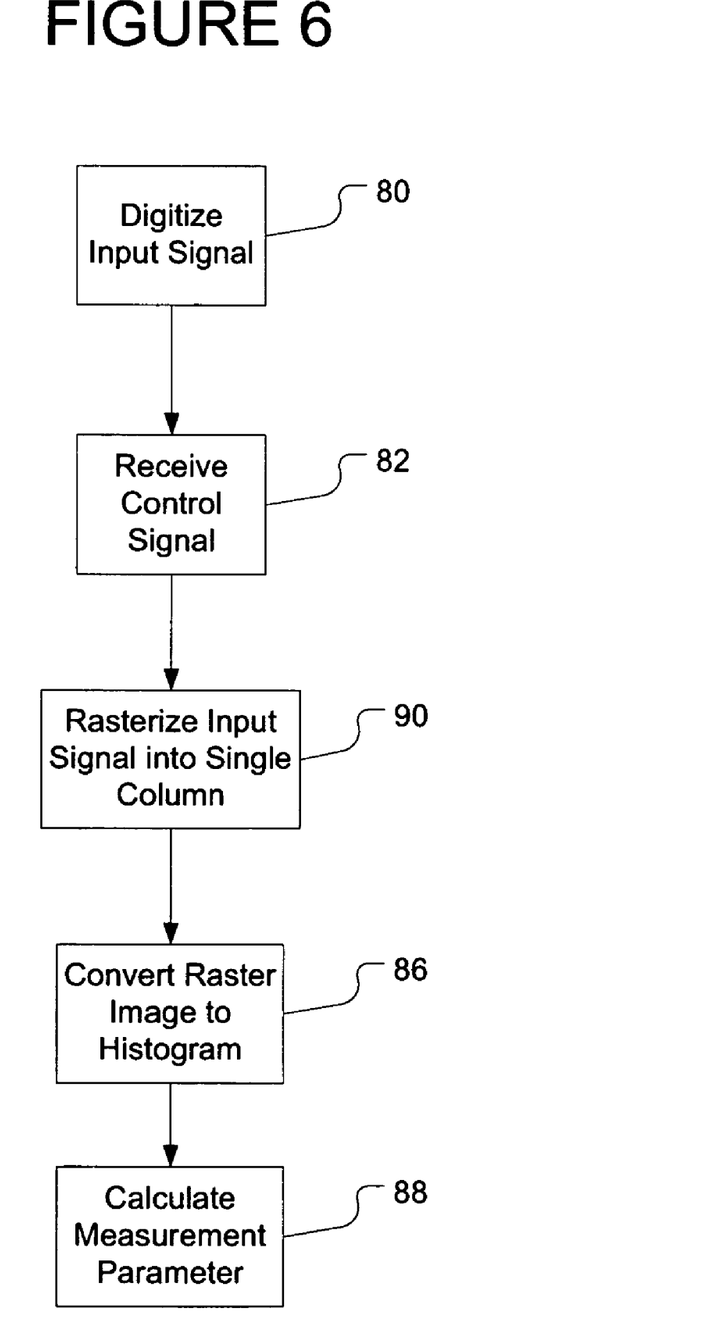
FIG. 6 is a flowchart of a method of measuring a parameter of a digitized signal according to another embodiment of the invention.

FIG. 6 is a flowchart of a method of measuring a parameter of a digitized signal according to another embodiment of the invention. In particular, rasterizing the input signal into the raster image in 84 may include rasterizing the input signal into a single column 90 of the raster image. Thus, as described above, each row or pixel represents an entry of the histogram. The converting of rows of the raster image into entries of a histogram in 86 may include copying the data of the raster image into the histogram.

In addition, converting rows of the raster image in 86 may include accessing the data structure of the raster image as a histogram. Since there may be a one-to-one correspondence with a value stored in a pixel of the raster image and a corresponding entry of a histogram, no additional processing may be needed. Thus, the data may be used by a processor by accessing the data of the raster image as if the data was a histogram. Alternatively, the data may be moved, copied, or otherwise manipulated to be in a format acceptable to calculating the parameter using the histogram in 88.

Furthermore, the method may include selecting a portion of the input signal spanning a selected time period. A user may desire to calculate measurements using a histogram formed over a particular time period of the input signal. Thus, a portion of the input signal spanning the time period may be selected. The portion is then rasterized into the raster image in 84.

Rasterizers may rasterize an input signal in a variety of modes. As described above, values of pixels may simulate the intensity of analog CRT displays. In order to simulate the lifetime of a dot on an analog CRT display, a rasterizer may use a decay function to reduce the intensity of pixels. However, in one example, when calculating a histogram, the values do not decay. Thus, the method may include rasterizing the input signal in an infinite persistence mode. As a result, the values in pixels are not reduced over time to simulate analog CRT displays.

Alternatively, the rasterizer may use a decay function in a variable persistence mode while rasterizing the input signal in 84. Thus, over time, the value of pixels of the raster image will decrease. As described above, there may be a maximum count for each pixel or row of a raster image. By reducing the counts stored in the pixels over time, a measurement of more samples than the maximum count may be made. Without reducing the counts, if new samples are added to a pixel or row that is already at the maximum count, the information provided by that sample is lost. While the count within a pixel or row may no longer represent an exact count of all samples at the associated digitizing level, the count may still be an indicator of the number of samples at the associated digitizing level beyond the maximum count without losing all of the information of the latter samples.

In addition, since the rasterizer may rasterize the input signal with infinite persistence, it may be necessary to reset the values in the pixels. For example, if a new signal is applied, a new measurement is selected, or a sufficient time has passed, the values of the pixels may be reset so that subsequent measurements can be made with current data. Thus, the method may include initializing the raster image, and repeating rasterizing the input signal 84, converting rows of the raster image into entries of a histogram 86, and calculating the parameter using the histogram 88. As a result, a new histogram may be generated allowing for new measurements to be calculated.

Figure 7:
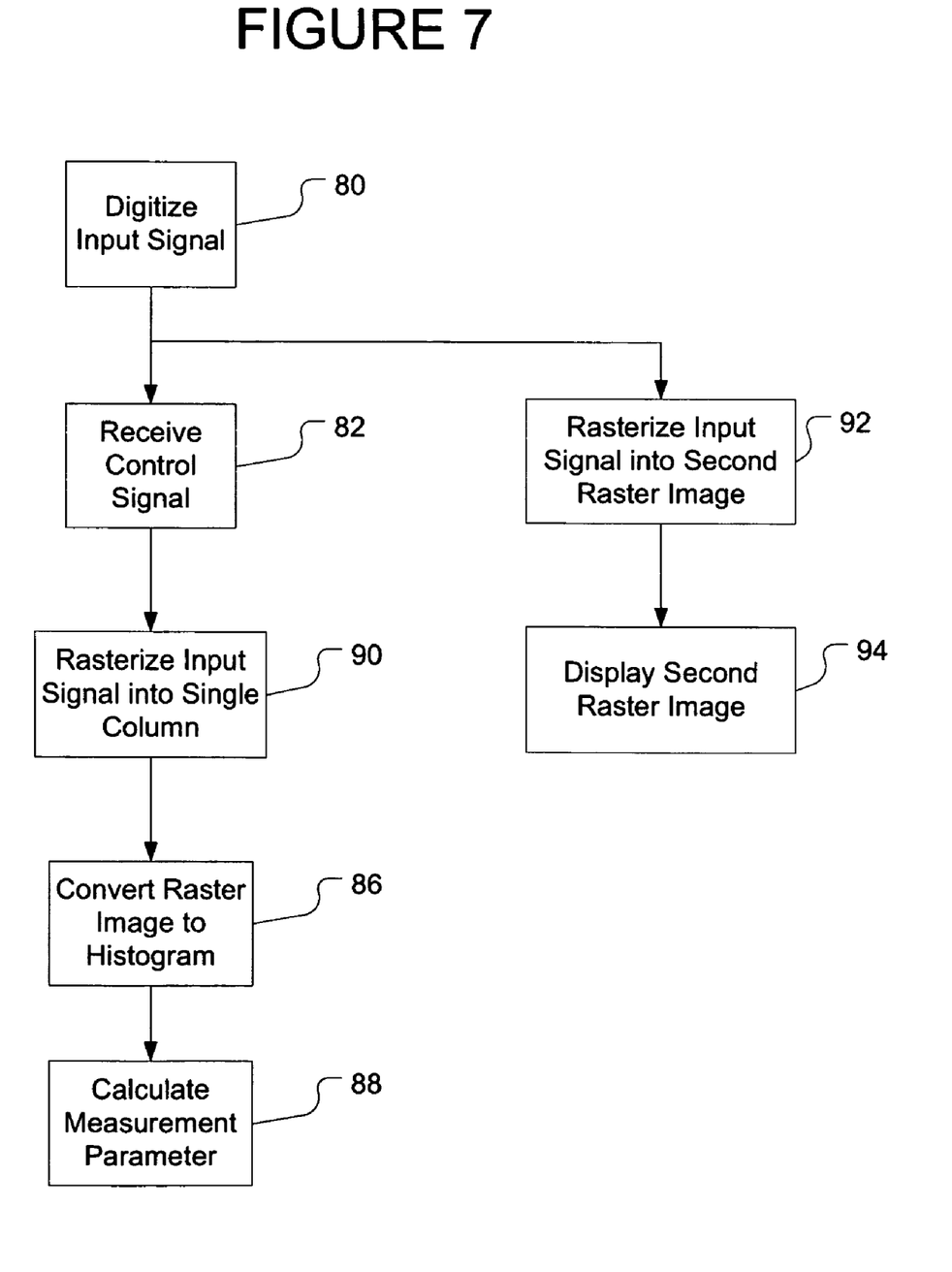
FIG. 7 is a flowchart of a method of measuring a parameter of a digitized signal according to another embodiment of the invention.

FIG. 7 is a flowchart of a method of measuring a parameter of a digitized signal according to another embodiment of the invention. The input signal is rasterized into a second raster image in 92. The second raster image is displayed in 94. The rasterization into the second raster image in 92 may occur substantially simultaneously as the input signal is rasterized in 84. Thus, the second raster image may be displayed in 94 substantially simultaneously as displaying a measurement calculated in 88.

Furthermore, an above-mentioned method may be implemented through an article of machine readable code, embodied in a machine readable medium that, when executed, causes the machine to perform the method. For example, a rasterizer may be controlled through firmware or other code executable by the rasterizer. Such code may be stored in a storage device such as storage 24 illustrated in FIG. 1. Thus, when a control signal is received, the code causes the rasterizer to rasterize the input signal into a raster image.

Furthermore, the machine readable code may include code for a variety of processors that may execute code. Thus, the machine readable code may include, for example, code such as processor specific and rasterizer specific code.

As a result, a device may be manufactured that has the capability of generating a histogram by rasterizing an input signal, but the capability is not implemented. However, through a subsequent update, whether software, firmware, or other code, the functionality of generating a histogram by rasterizing an input signal may be enabled in the device.

Although particular embodiments have been described, it will be appreciated that the principles of the invention are not limited to those embodiments. Variations and modifications may be made without departing from the scope of the invention as set forth in the following claims.

The invention claimed is:

1. An apparatus for use in a test and measurement instrument for calculating a parameter of a digitized signal comprising:
   an input for receiving an input signal;
   a digitizer to digitize said input signal into a digitized input signal;
   a first rasterizer coupled to said digitizer to generate a first raster image from the digitized input signal;
   a second rasterizer coupled to said digitizer to generate a second raster image from the digitized input signal;
   a processor to receive the first raster image;
   a control interface to receive a control signal indicating a request for a measurement;
   the first rasterizer being responsive to the control signal to generate the first raster image from the digitized input signal, and the processor being responsive to the control signal to generate a histogram from the first raster image;
   wherein said first rasterizer is configurable to generate the first raster image having only one column in response to the control signal;
   wherein said processor is configurable to generate each entry of the histogram from a corresponding row of said first raster image;
   wherein said processor calculates said parameter from said histogram and uses said parameter as a measurement of said digitized signal;
   and
   a display configured to display the second raster image, the second raster image being suitable for displaying a waveform representing the input signal.

2. The apparatus of claim 1 further comprising a user interface to generate the control signal in response to a user input.

3. The apparatus of claim 1 further comprising a network interface to receive the control signal.

4. A method of calculating a parameter of a digitized signal in a test and measurement instrument comprising the steps of:
   receiving an input signal at an input terminal;
   digitizing said input signal to produce a digitized input signal;
   receiving a control signal requesting a measurement;
   rasterizing said digitized input signal into a first raster image in a first rasterizer in response to the control signal and substantially simultaneously rasterizing said digitized input signal in a second rasterizer into a second raster image for display as a waveform representation of the input signal;
   converting the rows of the first raster image into entries of a histogram; and
   calculating the parameter using from the histogram and using said parameter as a measurement of said digitized signal;
   wherein the step of rasterizing the digitized input signal into the first raster image further comprises the step of rasterizing the digitized input signal into a single column of the first raster image.

5. The method of claim 4 further comprising the step of:
   selecting a portion of the input signal spanning a time period; and
   wherein the rasterizing the input signal into the first raster image step further comprises the step of rasterizing the portion of the input signal into the first raster image.

6. The method of claim 4 wherein the step of digitizing the input signal further comprises digitizing the input signal into a plurality of digitizing levels; and
   wherein the step of rasterizing the input signal into the first raster image further comprises the step of rasterizing each digitizing level into a corresponding row of the first raster image.

7. The method of claim 6 wherein the step of rasterizing each digitizing level into the corresponding row of the first raster image further comprises the step of rasterizing each digitizing level into a corresponding pixel of the first raster image.

8. The method of claim 4 comprising the further steps of:
   initializing the first raster image; and
   repeating the steps of rasterizing the input signal, converting rows of the first raster image into entries of a histogram, and calculating the parameter using the histogram.

9. The method of claim 4 wherein the step of rasterizing the input signal into the first raster image further comprises the step of rasterizing the input signal in a mode selected from a group consisting of an infinite persistence mode and a variable persistence mode.

10. The method of claim 4 further comprising the step of displaying the second raster image.

* * * * *